(12) United States Patent
Murase et al.

(10) Patent No.: US 10,888,943 B2
(45) Date of Patent: Jan. 12, 2021

(54) VISCOUS FLUID SUPPLY DEVICE

(71) Applicant: FUJI CORPORATION, Chiryu (JP)

(72) Inventors: Tadashi Murase, Gifu (JP); Yoshiyuki Fukuya, Chiryu (JP); Kazuya Matsuyama, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 272 days.

(21) Appl. No.: 16/072,653

(22) PCT Filed: Feb. 8, 2016

(86) PCT No.: PCT/JP2016/053690
§ 371 (c)(1),
(2) Date: Jul. 25, 2018

(87) PCT Pub. No.: WO2017/138077
PCT Pub. Date: Aug. 17, 2017

(65) Prior Publication Data
US 2019/0030632 A1    Jan. 31, 2019

(51) Int. Cl.
*B23K 3/00* (2006.01)
*B23K 3/08* (2006.01)
*B05C 11/04* (2006.01)
*B23K 1/00* (2006.01)
*B05C 5/02* (2006.01)
(Continued)

(52) U.S. Cl.
CPC .............. *B23K 3/082* (2013.01); *B05C 5/002* (2013.01); *B05C 5/027* (2013.01); *B05C 5/0216* (2013.01); *B05C 5/0291* (2013.01); *B05C 11/04* (2013.01); *B23K 1/00* (2013.01); *B23K 1/203* (2013.01); *B23K 3/00* (2013.01); *H05K 13/0465* (2013.01); *H05K 3/3489* (2013.01)

(58) Field of Classification Search
CPC ..... B23K 1/203; B23K 3/0638; B23K 3/0653
See application file for complete search history.

(56) References Cited

U.S. PATENT DOCUMENTS

2014/0366755 A1* 12/2014 Kobayashi .............. B41F 15/44
101/127

FOREIGN PATENT DOCUMENTS

| JP | 11-135006 A | 5/1999 |
|---|---|---|
| JP | 2000-167470 A | 6/2000 |

(Continued)

OTHER PUBLICATIONS

Extended European Search Report dated Aug. 26, 2019 in European Patent Application No. 16889779.1 citing document AO therein, 8 pages.

(Continued)

*Primary Examiner* — Erin B Saad
(74) *Attorney, Agent, or Firm* — Oblon, McClelland, Maier & Neustadt, L.L.P.

(57) ABSTRACT

A flux unit includes a flux supply device configured to eject flux to a storage tray, an ejection port configured to eject the flux, and an ejection port moving device configured to move the ejection port in the radial direction of the storage tray. By this, the flux is ejected in a wide range in the radial direction of the storage tray. Also, the storage tray is rotated by a tray rotation device. Thus, the film thickness of the flux ejected in the wide range of the storage tray is adjusted by a squeegee all at once. Thus, the time required for adjusting the film thickness of the flux can be reduced.

9 Claims, 7 Drawing Sheets

(51) Int. Cl.
*B05C 5/00* (2006.01)
*B23K 1/20* (2006.01)
*H05K 13/04* (2006.01)
*H05K 3/34* (2006.01)

(56) References Cited

FOREIGN PATENT DOCUMENTS

| | | |
|---|---|---|
| JP | 2008-10525 A | 1/2008 |
| JP | 2008-207217 A | 9/2008 |
| JP | 2012-199326 A | 10/2012 |

OTHER PUBLICATIONS

International Search Report dated May 10, 2016 in PCT/JP2016/053690 filed Feb. 8, 2016.

* cited by examiner

VISCOUS FLUID SUPPLY DEVICE

TECHNICAL FIELD

The present application relates to a viscous fluid supply device that supplies viscous fluid in a stored state in a storage tray.

BACKGROUND ART

In a viscous fluid supply device that supplies viscous fluid in a stored state in a storage tray, as disclosed in the patent literature below, the film thickness of the viscous fluid stored in the storage tray is adjusted by a squeegee.

CITATION LIST

Patent Literature

PTL 1: Japanese Unexamined Patent Application Publication No. 2012-199326

BRIEF SUMMARY

Technical Problem

In the viscous fluid supply device with the above configuration, it is desirable to appropriately adjust the film thickness of the viscous fluid stored in the storage tray by the squeegee. The present disclosure takes account of such circumstances and an object thereof is to provide a viscous fluid supply device capable of appropriately adjusting the film thickness of viscous fluid stored in a storage tray using a squeegee.

Solution to Problem

To attain the above object, the present disclosure provides a viscous fluid supply device including a storage tray configured to store viscous fluid; an ejection device configured to eject the viscous fluid to the storage tray; a squeegee configured to adjust a film thickness of the viscous fluid by contacting the viscous fluid ejected to the storage tray by the ejection device; and a first moving device configured to relatively move the storage tray and the squeegee, in which the ejection device has an ejection port configured to eject the viscous fluid, and a second moving device configured to relatively move the ejection port and the storage tray.

To attain the above object, the present disclosure also provides a viscous fluid supply device including a storage tray configured to store viscous fluid; an ejection device configured to eject the viscous fluid to the storage tray; a squeegee configured to adjust a film thickness of the viscous fluid by contacting the viscous fluid ejected to the storage tray by the ejection device; and a first moving device configured to relatively move the storage tray and the squeegee, in which the ejection device has multiple ejection ports configured to eject the viscous fluid.

Advantageous Effects

In the viscous fluid supply device described in the present disclosure, the ejection device configured to eject the viscous fluid to the storage tray has the ejection port configured to eject the viscous fluid, and the second moving device configured to relatively move the ejection port and the storage tray. Also, the ejection device has the multiple ejection ports configured to eject the viscous fluid. By this, the ejection device can eject the viscous fluid in a wide range of the storage tray. Thus, the film thickness of the viscous fluid ejected in the wide range of the storage tray can be adjusted by the squeegee, and the time required for adjusting the film thickness of the viscous fluid can be reduced.

DESCRIPTION OF EMBODIMENTS

Figure 1:
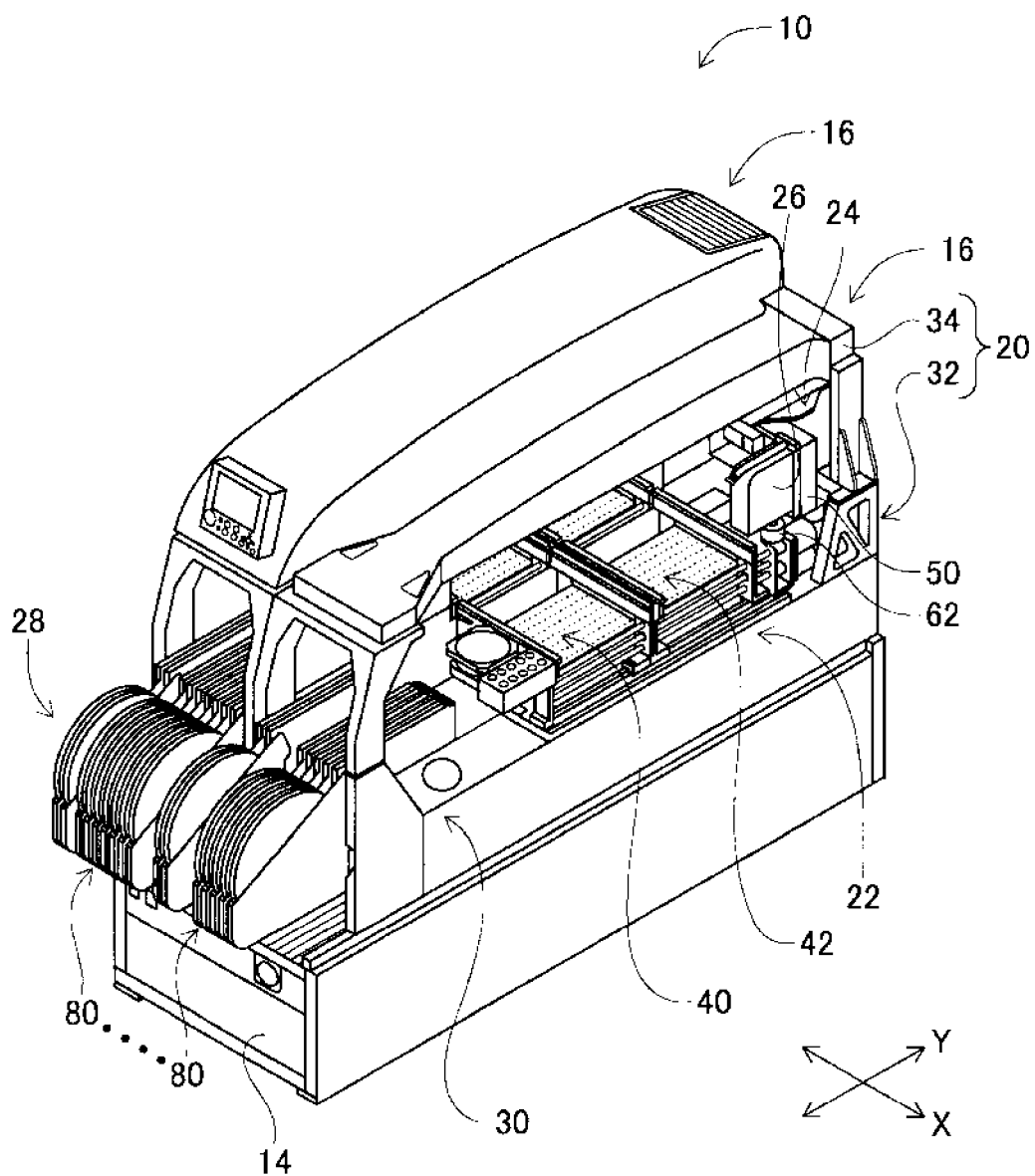
FIG. 1 is a perspective view showing a component mounter.
Figure 2:
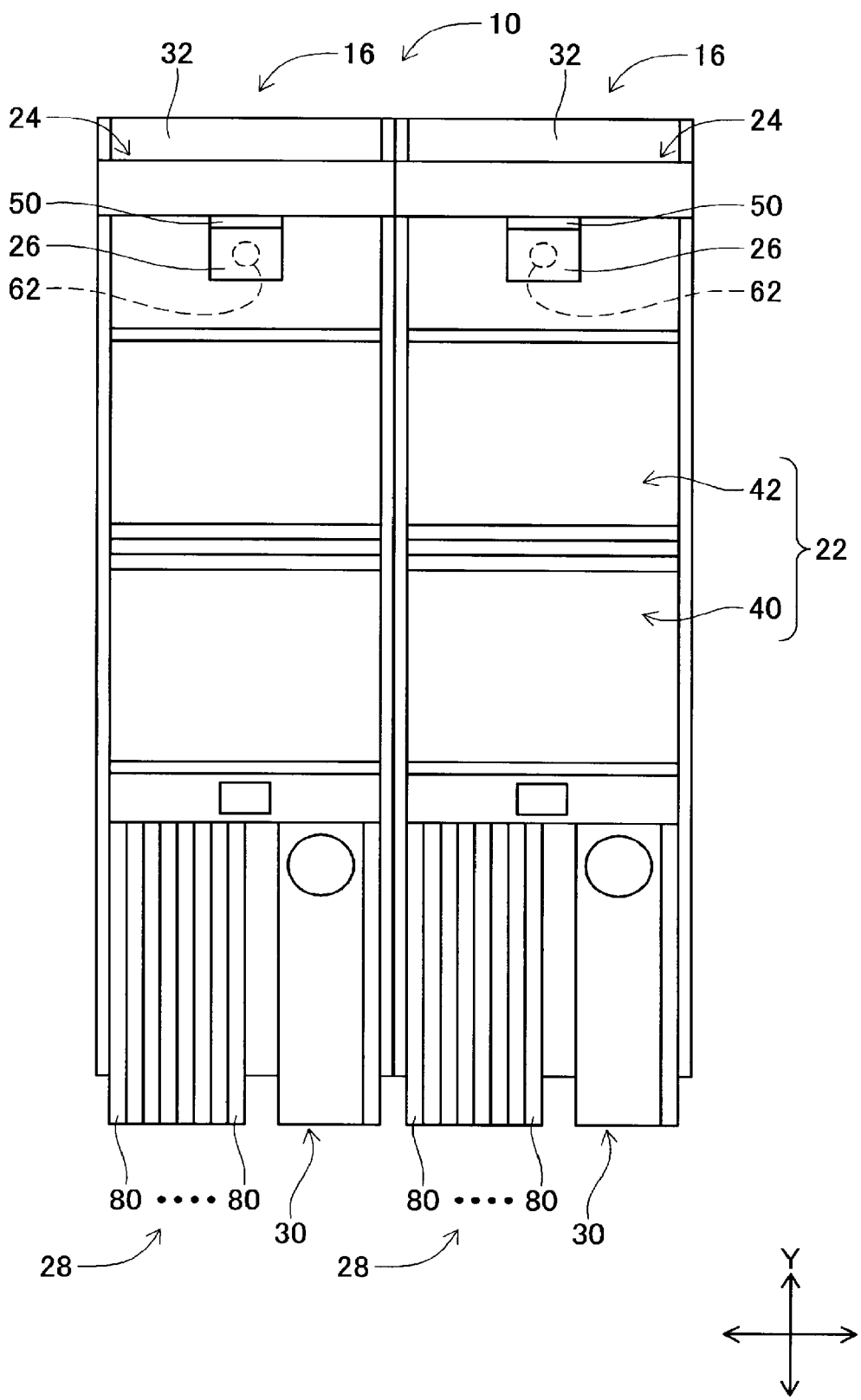
FIG. 2 is a plan view showing the component mounter.

The following describes in detail referring to the figures example embodiments of the present disclosure.
Configuration of Component Mounter Component mounter 10 according to the present embodiment is shown in FIGS. 1 and 2. FIG. 1 is a perspective view of component mounter 10, and FIG. 2 is a plan view showing component mounter 10 when viewed from above in a state in which a cover and so forth have been removed. Component mounter 10 is a device for mounting electronic components on a circuit board. Component mounter 10 includes one system base 14, and two mounters 16 arranged side by side on system base 14. In the following description, the X-axis direction refers to the direction in which mounters 16 are arranged side by side, and the Y-axis direction refers to the horizontal direction orthogonal to the X-axis direction.

Each mounter 16 mainly includes mounter body 20, conveyance device 22, mounting head moving device (hereinafter in some cases abbreviated to "moving device") 24, mounting head 26, supply device 28, and flux unit 30. Mounter body 20 is configured of frame section 32 and beam section 34 that is mounted on frame section 32.

Conveyance device 22 includes two conveyor devices 40 and 42. Conveyor devices 40 and 42 are arranged on frame section 32 such that conveyor devices 40 and 42 are parallel to each other and extend in the X-axis direction. Conveyor devices 40 and 42 each convey a circuit board supported thereby in the X-axis direction using electromagnetic motor 46 (refer to FIG. 5). Also, the circuit board is fixedly held at a predetermined position by board holding device 48 (refer to FIG. 5).

Moving device 24 is an XY-robot type moving device including electromagnetic motor 52 (refer to FIG. 5) that slides slider 50 in the X-axis direction, and electromagnetic motor 54 (refer to FIG. 5) that slides slider 50 in the Y-axis direction. Mounting head 26 is attached to slider 50, and mounting head 26 is moved to any position on frame section 32 by operation of electromagnetic motor 52 and electromagnetic motor 54.

Mounting head 26 mounts electronic components on a circuit board. Suction nozzle 62 is provided on the lower end face of mounting head 26. Suction nozzle 62 is connected to positive and negative pressure supply device 66 (refer to FIG. 5) via a negative pressure air and positive pressure air supply passage. Suction nozzle 62 picks up and holds an electronic component using negative pressure, and releases the held electronic component using positive pressure. Also, mounting head 26 has nozzle lifting and lowering device 68 (refer to FIG. 5) that lifts and lowers suction nozzle 62. Mounting head 26 changes the position in the up-down direction of the held electronic component using nozzle lifting and lowering device 68. Note that suction nozzle 62 can be attached to and removed from mounting head 26, and can be exchanged in accordance with the size and so forth of the electronic component.

Supply device 28 is a feeder type supply device that is arranged at one end in the Y-axis direction of frame section 32. Supply device 28 has tape feeder 80. Tape feeder 80 accommodates taped components that are electronic components configured in a wound tape form. Tape feeder 80 feeds the taped components using feed device 82 (refer to FIG. 5). Thus, feeder type supply device 28 supplies an electronic component at a supply position through the feed of the taped components. Note that tape feeder 80 can be attached to and removed from frame section 32 to facilitate the exchange of electronic components and so forth.

Figure 3:
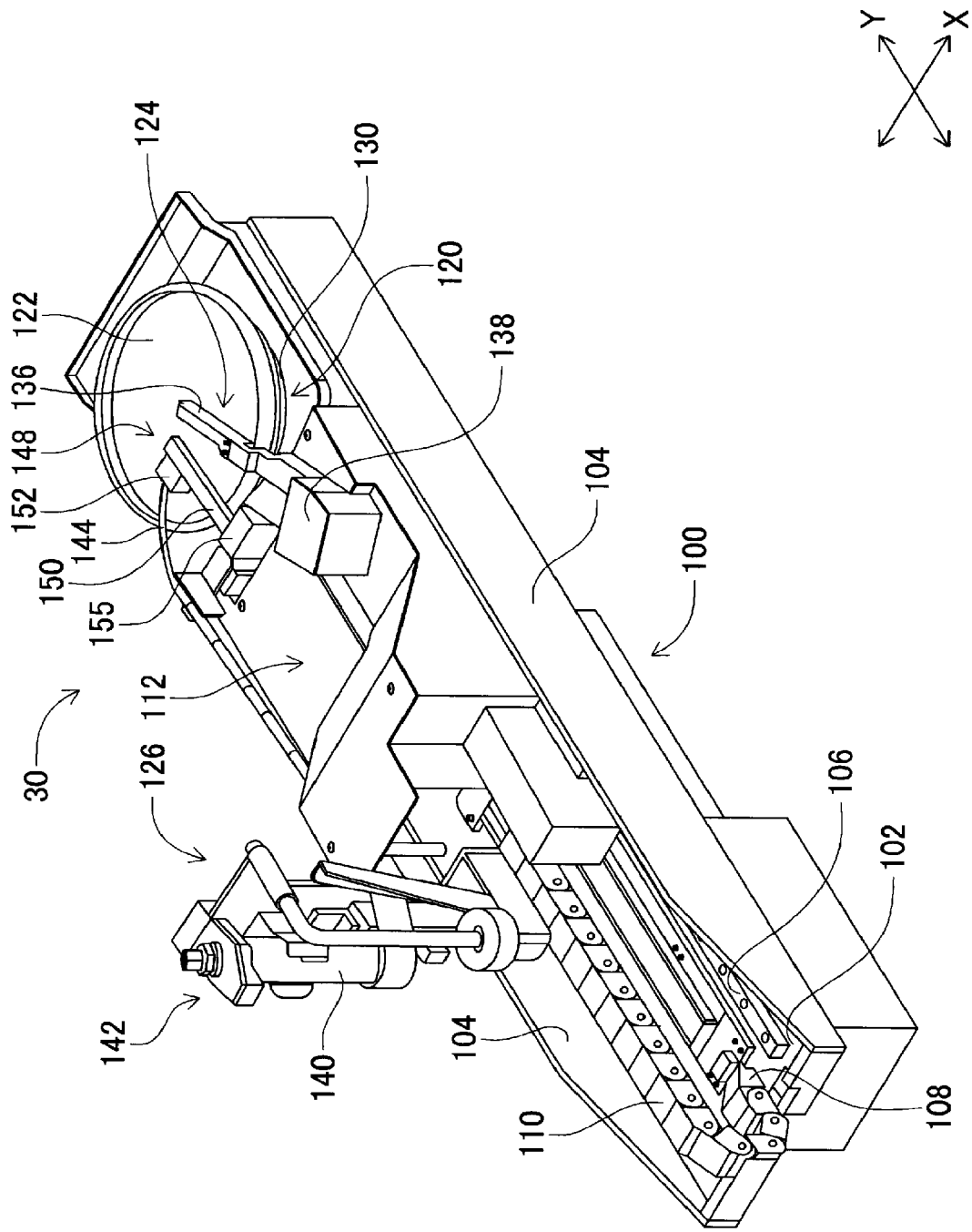
FIG. 3 is a perspective view showing a flux unit.
Figure 4:
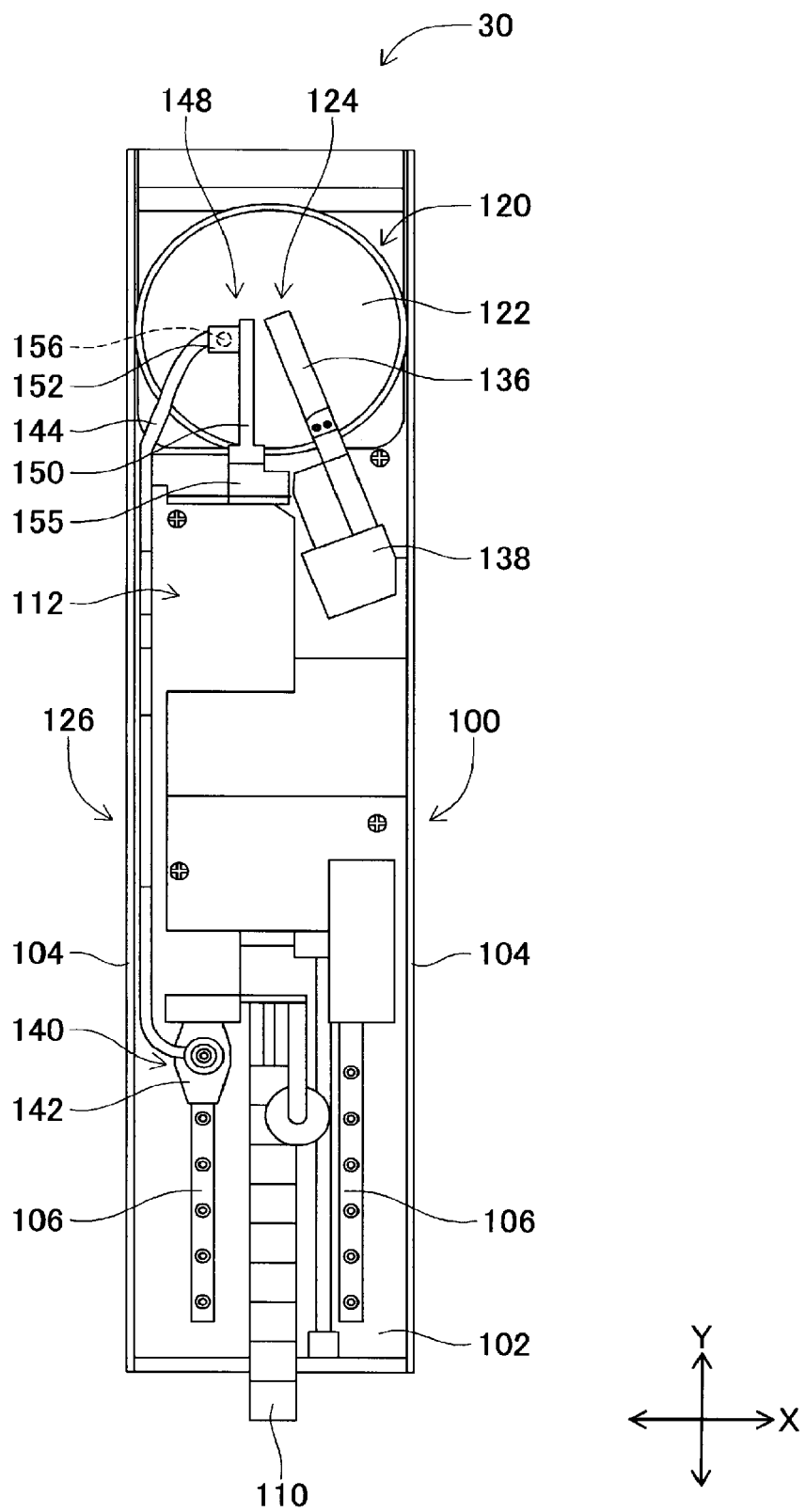
FIG. 4 is a plan view showing the flux unit.

Flux unit 30 is a unit that supplies flux to be applied to an electronic component, and is arranged next to supply device 28. Flux unit 30 is described below in more detail with reference to FIGS. 3 and 4. FIG. 3 is a perspective view of flux unit 30, and FIG. 4 is a plan view showing flux unit 30 when viewed from above.

Flux unit 30 includes main body base 100. Main body base 100 includes rectangular bottom plate 102 extending in the Y-axis direction, and a pair of side plates 104 extending perpendicularly upward from the ends in the X-axis direction of bottom plate 102; and configures a U-shaped groove extending in the Y-axis direction. A pair of guide rails 106 is arranged on the upper face of bottom plate 102 of main body base 100. Guide rails 106 are arranged side by side in the X-axis direction such that guide rails 106 extend in the Y-axis direction. Also, cable connecting section 108 is provided at an end in the Y-axis direction on bottom plate 102 of main body base 100. One end of cable 110 that accommodates various types of wires, such as a power supply wire and a signal wire, is connected to cable connecting section 108.

Also, flux unit 30 has unit main body 112. Unit main body 112 is supported slidably by the pair of guide rails 106 along guide rails 106, on the upper face of bottom plate 102 of main body base 100. Thus, when an operator causes unit main body 112 to slide, unit main body 112 moves toward the inside of component mounter 10 or toward the outside of component mounter 10. Note that the other end of cable 110 is connected to unit main body 112, and electric power and various data are transmitted to unit main body 112 via cable 110.

Further, flux unit 30 includes tray rotation device 120, storage tray 122, film thickness adjustment device 124, and flux supply device 126. Tray rotation device 120 has stage 130, and stage 130 is arranged on the upper face of an end portion of unit main body 112 on the inner side of component mounter 10 in the Y-axis direction. Stage 130 is substantially disc-shaped, and arranged on the upper face of unit main body 112 in a manner rotatable around the center. Stage 130 is controllably rotated by the driving of electromagnetic motor 132 (refer to FIG. 5).

Storage tray 122 is a shallow tray being circular when viewed from above. Storage tray 122 is arranged on stage 130 of tray rotation device 120, and is controllably rotated by tray rotation device 120.

Film thickness adjustment device 124 is arranged on the upper face of unit main body 112, and has squeegee 136 and lifting and lowering device 138. Squeegee 136 is substantially long-plate-shaped, extends to a position above storage tray 122 in parallel to storage tray 122, and is arranged at a position with a predetermined height from the bottom face of storage tray 122. Squeegee 136 is arranged such that squeegee 136 extends substantially in the radial direction of storage tray 122. The distal end of squeegee 136 extends to a position near the center of storage tray 122. The base end of squeegee 136 extends outside storage tray 122, and the base end of squeegee 136 is supported by lifting and lowering device 138. Lifting and lowering device 138 holds squeegee 136 in a state parallel to storage tray 122 such that squeegee 136 can be lifted and lowered, and lifts and lowers squeegee 136 to any height.

Flux supply device 126 is arranged on the upper face of unit main body 112, and has syringe 140, syringe holding section 142, liquid pumping tube 144, air supply device 146 (refer to FIG. 5), and ejection port moving device 148. Syringe 140 is substantially cylindrical, and accommodates flux therein. The flux is viscous fluid with high viscosity, and functions as an adhesive for an electronic component. Syringe holding section 142 is arranged at the end of unit main body 112 opposite to the arrangement position of storage tray 122, and is configured of a clip and a belt. Syringe 140 is fixedly held in a state in which syringe 140 is vertically arranged using the clip and the belt.

Liquid pumping tube 144 is connected at one end thereof to the lower end face of syringe 140, and extends in the Y-axis direction toward storage tray 122. The other end of liquid pumping tube 144 extends to a position above storage tray 122. Also, air supply device 146 is connected to syringe 140 via an air flow path (not shown). Air is supplied from air supply device 146 to the inside of syringe 140, and thus flux is pushed out from syringe 140 using air pressure, passes through liquid pumping tube 144, and is supplied to storage tray 122.

Figure 5:
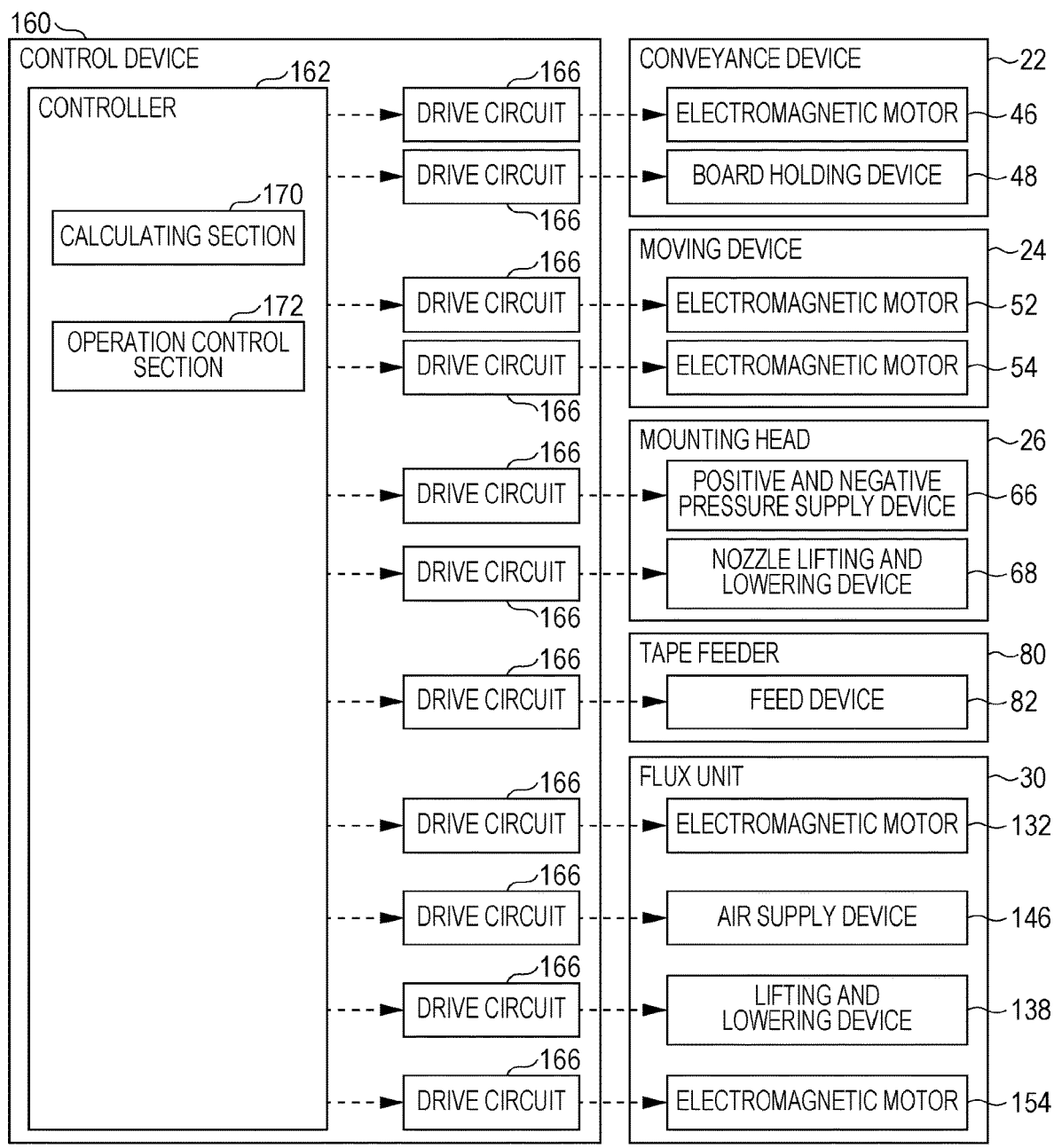
FIG. 5 is a block diagram showing a control device.

Ejection port moving device 148 has holding rod 150, slider 152, and electromagnetic motor 154 (refer to FIG. 5). Holding rod 150 is supported at one end thereof substantially horizontally by rod support table 155 arranged near storage tray 122. The other end of holding rod 150 extends to a position above storage tray 122, and extends to a center portion of storage tray 122. Note that holding rod 150 is arranged next to squeegee 136 of film thickness adjustment device 124 such that holding rod 150 extends substantially in the radial direction of storage tray 122 similarly to squeegee 136.

Slider 152 is held by holding rod 150 slidably in the axial direction of holding rod 150. Slider 152 slides to any position at any speed by the driving of electromagnetic motor 154. Slider 152 fixedly holds the end of liquid pumping tube 144 in a state in which the opening of the end of liquid pumping tube 144 extending to the position above storage tray 122, that is, ejection port 156 that ejects the flux faces storage tray 122. Thus, ejection port 156 of liquid pumping tube 144 moves along holding rod 150. Note that liquid pumping tube 144 is formed from a flexible material, and bends by the movement of slider 152.

As shown in FIG. 5, mounter 16 further includes control device 160. Control device 160 has controller 162 including a CPU, ROM, RAM, and so forth, and is mainly configured of a computer. Controller 162 is connected to multiple drive circuits 166 that are connected to electromagnetic motors 46, 52, 54, 132, and 154, board holding device 48, positive and negative pressure supply device 66, nozzle lifting and lowering device 68, feed device 82, lifting and lowering device 138, and air supply device 146. Thus, operation of conveyance device 22, moving device 24, and so forth is controlled by controller 162.

Mounting Work by Mounter

Mounter 16 with the above configuration can perform mounting work with respect to a circuit board held in conveyance device 22 using mounting head 26. Specifically, based on commands of controller 162, a circuit board is conveyed to a work position, and fixedly held at that position by board holding device 48. Also, tape feeder 80, based on commands of controller 162, feeds the taped components and supplies an electronic component at the supply position. Then, mounting head 26, based on commands of controller 162, moves to a position above the supply position of the electronic component and picks up and holds the electronic component using suction nozzle 62.

Then, mounting head 26, based on commands of controller 162, moves to a position above storage tray 122 and lowers suction nozzle 62 using nozzle lifting and lowering device 68. Thus, the flux stored in storage tray 122 can adhere to the electronic component picked up and held by suction nozzle 62. After the adhesion of the flux in storage tray 122, based on commands of controller 162, mounting head 26 moves to a position above the circuit board and mounts the held electronic component at a predetermined position on the circuit board. Thus, the electronic component is mounted in a state in which the electronic component is bonded with the flux at the predetermined position on the circuit board.

Storage and Resupply of Flux in Storage Tray

As described above, in component mounter 10, the flux stored in storage tray 122 adheres to the electronic component, and the electronic component is bonded onto the circuit board with the flux. At this time, the film thickness of the flux stored in storage tray 122 is equalized to equalize the adhesion amount of flux to the electronic component.

Specifically, first in flux unit 30, empty storage tray 122 is set on stage 130 of tray rotation device 120. When air is supplied to syringe 140 by operation of air supply device 146, the flux is pushed out from the inside of syringe 140, passes through liquid pumping tube 144, and is supplied from ejection port 156 to the inside of storage tray 122. At this time, slider 152 slides from the outer edge toward the center of storage tray 122, and the flux is supplied from ejection port 156 to multiple portions of storage tray 122. Note that, when the flux is being supplied from ejection port 156, slider 152 stops.

Specifically, slider 152 slides from the outer edge toward the center of storage tray 122. At this time, slider 152 stops when slider 152 has slid by a predetermined distance. When slider 152 stops, a predetermined amount of flux is supplied from ejection port 156. Then, when the supply with the flux from ejection port 156 stops, slider 152 slides again by a predetermined distance, and then the slider 152 stops. Then, a predetermined amount of flux is supplied from ejection port 156. In this way, the sliding and stopping of slider 152 are repeated, and when slider 152 stops, the flux is supplied from ejection port 156. Thus, the flux is supplied to multiple portions of storage tray 122, in a direction in which holding rod 150 extends, in a state in which the multiple portions are separated by a predetermined distance.

While flux supply device 126 supplies the flux, storage tray 122 is rotated by tray rotation device 120. By this, the flux supplied from ejection port 156 to storage tray 122 is scraped by squeegee 136 and flattened. At this time, the flux has a film thickness corresponding to the height of squeegee 136, that is, the distance between the bottom face of storage tray 122 and the lower end of a scraping face of squeegee 136. That is, by performing the supply of the flux to storage tray 122 and the rotation operation of storage tray 122 in coordination with each other, the flux stored in storage tray 122 becomes a flux film with a uniform thickness by squeegee 136. By adjusting squeegee 136 to a certain height by lifting and lowering device 138, the film thickness of the flux film is adjusted. The film thickness of the flux film is about several hundreds of microns.

The supply stop timing of the flux to storage tray 122 and the rotation stop timing of storage tray 122 are determined based on a detection value of a sensor (not shown) provided on squeegee 136. The sensor detects the height of the flux scraped by squeegee 136 and remaining on squeegee 136. When the flux supplied to storage tray 122 is not a uniform flux film, the flux scraped by squeegee 136 does not remain on squeegee 136, and is flattened in storage tray 122. When the flux supplied to storage tray 122 becomes a uniform flux film, the flux scraped by squeegee 136 remains on squeegee 136. The height of the flux remaining on squeegee 136 is detected by the sensor, and it is determined whether the detected height of the flux is a predetermined height. When the detected height of the flux is the predetermined height, it is determined that the flux is a uniform flux film, and the supply of the flux to storage tray 122 and the rotation of storage tray 122 are stopped.

In flux unit 30, since the flux is supplied from ejection port 156 to multiple portions of storage tray 122 as described above, the time required for equalizing the film thickness of the flux supplied to storage tray 122 can be reduced. Specifically, in a flux unit of related art, an ejection port for flux is fixed above storage tray 122, and the flux is supplied only to a predetermined portion of storage tray 122. Also, since the flux has high viscosity, the flux supplied onto storage tray 122 hardly spreads at all due to its own weight, and is deposited in a mound. When a large amount of flux is supplied to one portion of storage tray 122, an excessive load is applied to squeegee 136, and squeegee 136 may break. If a large amount of flux is supplied to one portion of storage tray 122, to equalize the mound of flux, storage tray 122 has to be rotated many times, and the time required for equalizing the film thickness of the flux supplied to storage tray 122 is increased.

Moreover, in the flux unit of related art, even if only a small amount of flux is supplied to one portion of storage tray 122 and the flux is scraped by squeegee 136, the small amount of flux is flattened by rotation of storage tray 122, and a small amount of flux is supplied again onto the flattened flux. Then, that small amount of flux is flattened by the rotation of storage tray 122. In this manner, the film thickness of the flux supplied to storage tray 122 is equalized by repeating the supply of a small amount of flux and the rotation of storage tray 122 many times, thus the time required for equalizing the film thickness of the flux supplied to storage tray 122 increases.

In contrast, with flux unit 30, since ejection port 156 is movable along holding rod 150, the flux is supplied to multiple portions of storage tray 122 lined up in the axial direction of holding rod 150. When the flux is supplied, by rotating storage tray 122 in a direction in which the multiple flux supply portions are lined up, that is, a direction different from the axial direction of holding rod 150, the flux supplied to the multiple portions and squeegee 136 move relative to each other. By this, the flux supplied to the multiple portions is simultaneously flattened by squeegee 136. Thus, the flux supplied to storage tray 122 can be equalized without rotating storage tray 122 many times, and the time required for equalizing the film thickness of the flux supplied to storage tray 122 is reduced.

Storage tray 122 is circular, therefore the area of storage tray 122 in a circumferential direction increases at a portion nearer to the outer edge of storage tray 122 and decreases at a portion nearer to the center of storage tray 122. For example, when the same amount of flux is supplied from ejection port 156 to multiple portions of storage tray 122, the flux supplied to a portion near the center of storage tray 122 is scraped early by squeegee 136, and remains on squeegee 136. The remaining flux moves to a portion near the outer edge of storage tray 122 by the rotation of storage tray 122, and is flattened at the portion near the outer edge of storage tray 122. In such a case, storage tray 122 has to be rotated many times, and the time required for equalizing the film thickness of the flux supplied to storage tray 122 is increased. Taking these circumstances into account, with flux unit 30, when flux is supplied to an empty flux unit 30, a larger amount of flux is supplied to a portion nearer to the outer edge of storage tray 122. Thus, the number of rotations of storage tray 122 can be decreased, and the time required for equalizing the film thickness of the flux supplied to storage tray 122 can be further reduced.

After the film thickness of the flux supplied to storage tray 122 is equalized, mounting work is performed. During the mounting work, when an electronic component held by suction nozzle 62 is dipped in the flux stored in storage tray 122 and the flux adheres to the electronic component, a recess corresponding to the amount of flux adhering to the electronic component is generated at the dipped portion of the electronic component. After the mounting work has been performed for a predetermined number of electronic components, resupply work of the flux to storage tray 122 is performed.

Specifically, also when flux is resupplied to storage tray 122 storing the flux, the flux is supplied to multiple portions of storage tray 122, and storage tray 122 rotates at this time similarly to when flux is supplied to empty storage tray 122. During the mounting work, an electronic component is dipped in a predetermined region of storage tray 122, and the flux adheres to the electronic component. The predetermined region is typically set at a portion near the center of storage tray 122. This is because, if an electronic component is dipped in the flux at a portion near the outer edge of storage tray 122, the outer edge of storage tray 122 may interfere with the electronic component and so forth. Thus, the amount of flux stored in storage tray 122 decreases at a portion nearer to the center of storage tray 122 by the adhesion of the flux to the electronic component. With flux unit 30, in a case where the flux is resupplied to storage tray 122 storing the flux, when the flux is supplied to multiple portions of storage tray 122, the supply amount of flux is increased at a portion nearer to the center of storage tray 122. That is, the supply amount of flux is decreased at a portion nearer to the outer edge of storage tray 122. Thus, the flux can be resupplied by a larger amount to a portion with less flux, and the flux can be appropriately resupplied.

Furthermore, with flux unit 30, the used amount of flux is calculated, and when the flux is resupplied, the calculated amount of flux is supplied. Specifically, controller 162 stores the amount of flux by which the flux is expected to adhere to an electronic component depending on the type of electronic component (hereinafter, described as "expected adhesion amount"). Every time the flux adheres to an electronic component during the mounting work, controller 162 specifies the expected adhesion amount stored depending on the electronic component. Every time the expected adhesion amount is specified, the specified expected adhesion amount is totaled. When the flux is resupplied to storage tray 122, an amount of flux corresponding to the totaled expected adhesion amount is distributed to multiple supply portions such that the supply amount of flux increases at a portion nearer to the center of storage tray 122. Then, the distributed amounts of flux are supplied to the multiple portions of storage tray 122. Thus an appropriate amount of flux can be resupplied to storage tray 122.

Note that, as shown in FIG. 5, controller 162 has calculating section 170 and operation control section 172. Calculating section 170 is a functional section for specifying an expected adhesion amount every mounting work for an electronic component, and totaling the specified expected adhesion amount. Operation control section 172 is a functional section for controlling operation of air supply device 146 and electromagnetic motor 154 to resupply the flux to storage tray 122 by the amount corresponding to the expected adhesion amount totaled by calculating section 170.

Second Embodiment

Figure 6:
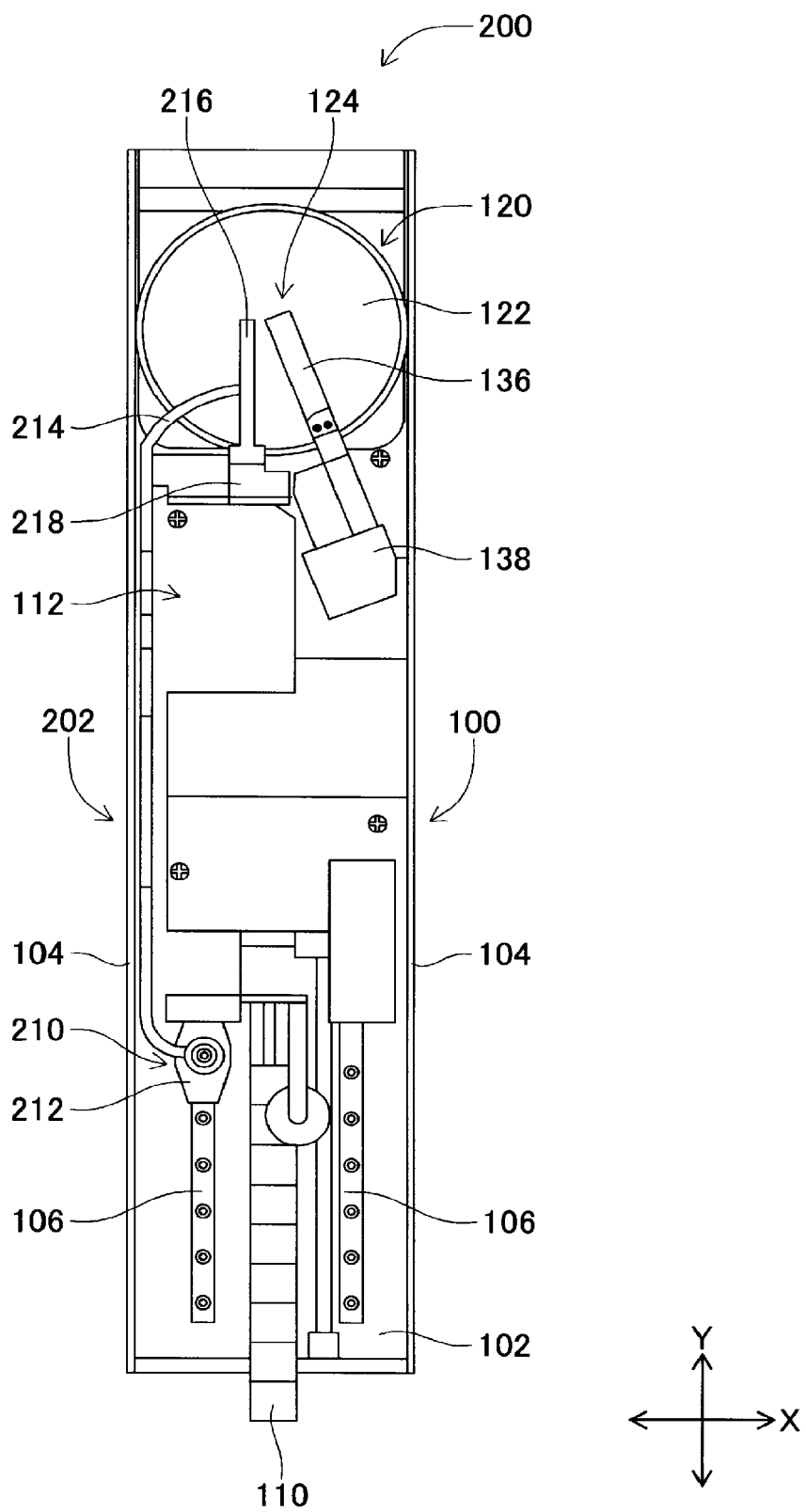
FIG. 6 is a plan view showing a flux unit of a second embodiment.

FIG. 6 shows flux unit 200 of a second embodiment. Flux unit 200 includes the same constituent elements as those of flux unit 30 of the first embodiment except for flux supply device 202. Therefore, the same reference numbers are given to constituent elements that are the same as constituent elements of flux unit 30 and the description of those items is omitted.

Flux supply device 202 has syringe 210, syringe holding section 212, liquid pumping tube 214, and flux supply body 216. Syringe 210, syringe holding section 212, and liquid pumping tube 214 have the same configurations as those of syringe 140, syringe holding section 142, and liquid pumping tube 144 of flux supply device 126 of the first embodiment, and the description of those items is omitted.

Flux supply body 216 is substantially elongated, and is substantially horizontally supported at one end thereof by support table 218 arranged near storage tray 122. The other end of flux supply body 216 extends to a position above storage tray 122, and extends to a center portion of storage tray 122. Note that flux supply body 216 is arranged next to squeegee 136 of film thickness adjustment device 124, and is arranged such that flux supply body 216 extends substantially in the radial direction of storage tray 122 similarly to squeegee 136.

Figure 7:
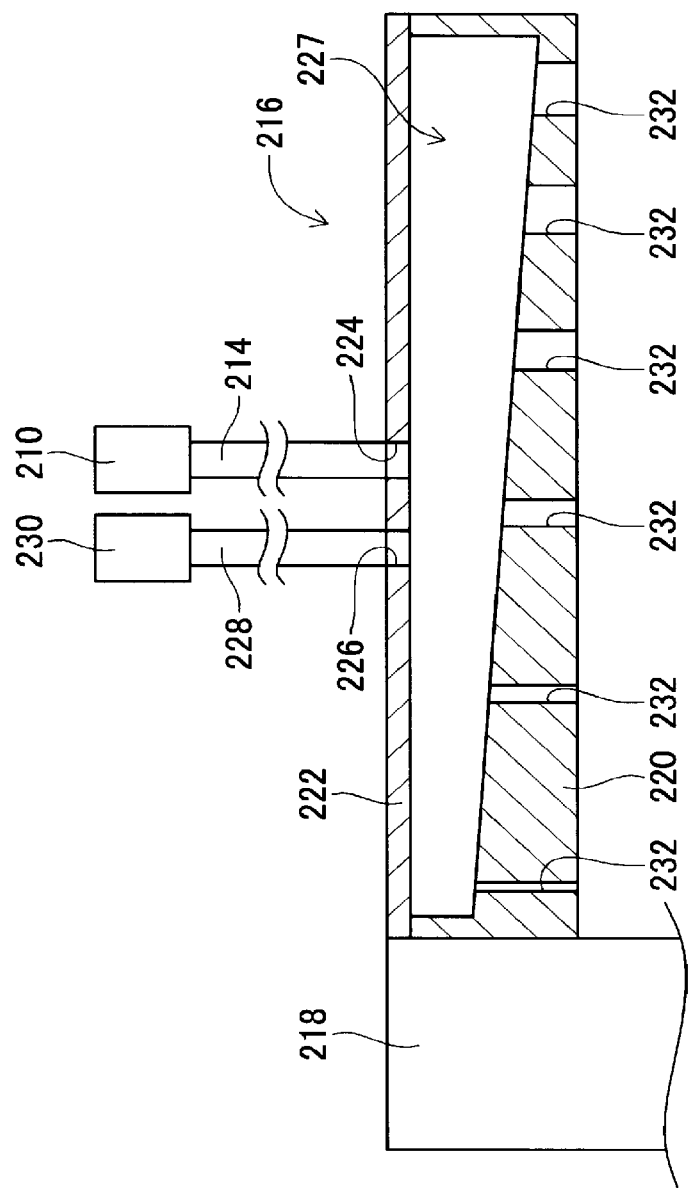
FIG. 7 is a sectional view showing a flux supply body.

As shown in FIG. 7, flux supply body 216 has main body section 220 and lid section 222. Main body section 220 is substantially elongated box-shaped, and the upper face thereof is open. The opening in the upper face of main body section 220 is closed with lid section 222, and thus the inside of main body section 220 is hermetically sealed. Two through-holes 224 and 226 are formed in lid section 222. Liquid pumping tube 214 is connected to through-hole 224. Thus, the flux is supplied from syringe 210 via liquid pumping tube 214 to the inside of main body section 220, that is, storage section 227. One end of air pipe 228 is connected to through-hole 226, and the other end of air pipe 228 is connected to air supply device 230. Thus, air is supplied from air supply device 230 via air pipe 228 to storage section 227.

The bottom face of main body section 220, that is, the bottom face of storage section 227 is an inclined face rising from one end toward the other end in the longitudinal direction. That is, the distance between the bottom face of storage section 227 and the upper face of storage section 227 is decreased from the one end toward the other end in the longitudinal direction. Thus, the area of a cross section orthogonal to the longitudinal direction of storage section 227 decreases from the one end toward the other end in the longitudinal direction, and the accommodation amount of flux in storage section 227 decreases from the one end toward the other end in the longitudinal direction. Note that the other end of main body section 220 is fixed to support table 218. That is, in flux supply body 216 extending to a position above storage tray 122, the accommodation amount of flux in storage section 227 is decreased toward the outer edge of storage tray 122, and is increased toward the center of storage tray 122.

Also, multiple ejection ports 232 are formed in the bottom face of storage section 227. Multiple ejection ports 232 extend through the bottom face of storage section 227 in the up-down direction, and are formed in line in the longitudinal direction of storage section 227. Multiple ejection ports 232 have different inner diameters that are decreased toward an end on the side fixed to support table 218. That is, the inner diameters of multiple ejection ports 232 are decreased toward the outer edge of storage tray 122, and are increased toward the center of storage tray 122. The distance between two adjacent ejection ports 232 of multiple ejection ports 232 (hereinafter in some cases described as "separation distance") is increased toward the end on the side fixed to support table 218. That is, the separation distance of multiple ejection ports 232 is increased toward the outer edge of storage tray 122, and is decreased toward the center of storage tray 122.

With flux supply device 202 thus configured, when the flux is supplied to storage tray 122, the flux is supplied to multiple portions of storage tray 122 similarly to flux unit 30 of the first embodiment. Specifically, the flux is fed from syringe 210 via liquid pumping tube 214 to storage section 227 of flux supply body 216. Thus, the flux is stored in storage section 227. Then, air supply device 230 feeds air via air pipe 228 to storage section 227. Thus, the flux stored in storage section 227 is ejected from multiple ejection ports 232 by air pressure. The flux ejected from multiple ejection ports 232 is supplied to multiple portions in the radial direction of storage tray 122.

When the flux is supplied to storage tray 122 by flux supply device 202, storage tray 122 is rotated by tray rotation device 120. At this time, storage tray 122 is rotated in a direction intersecting with a direction in which the multiple flux supply portions are lined up, that is, the radial direction of storage tray 122, and by this, the flux supplied to the multiple portions and squeegee 136 move relative to each other. The flux supplied to the multiple portions is simultaneously flattened by squeegee 136. Thus, the flux supplied to storage tray 122 can be equalized in a short period of time without rotating storage tray 122 many times.

Moreover, since flux supply body 216 has multiple ejection ports 232 with different inner diameters and different separation distances as described above, during the mounting work, the flux can be appropriately resupplied to storage tray 122 after the flux stored in storage tray 122 has been used. Specifically, as described above, during the mounting work, an electronic component is dipped in a region near the center of storage tray 122, and the flux adheres to the electronic component. Thus, the amount of flux stored in storage tray 122 is smaller at a portion nearer to the center of storage tray 122 by the adhesion of the flux to the electronic component. That is, in flux supply body 216, the inner diameters of multiple ejection ports 232 are increased toward the center of storage tray 122, and the separation distances of multiple ejection ports 232 are decreased toward the center of storage tray 122. Thus, when the flux is supplied from flux supply body 216 to the multiple portions of storage tray 122, the flux can be supplied by a larger amount to a portion nearer to the center of storage tray 122, and the flux can be appropriately resupplied.

Furthermore, in flux supply body 216, the accommodation amount of flux in storage section 227 is increased toward the center of storage tray 122. This is because a larger amount of flux is resupplied to a portion nearer to the center of storage tray 122 as described above. Thus, the flux to storage tray 122 can be appropriately maintained.

Note that, in the above embodiment, flux unit 30 is an example of a viscous fluid supply device. Tray rotation device 120 is an example of a first moving device. Storage tray 122 is an example of a storage tray. Flux supply device 126 is an example of an ejection device. Squeegee 136 is an example of a squeegee. Ejection port moving device 148 is an example of a second moving device. Ejection port 156 is an example of an ejection port. Control device 160 is an example of a control device. Calculating section 170 is an example of an acquiring section. Operation control section 172 is an example of an operation control section. Flux unit 200 is an example of a viscous fluid supply device. Flux supply device 202 is an example of an ejection device. Storage section 227 is an example of an accommodation section. Ejection port 232 is an example of an ejection port.

The present disclosure is not limited to the above embodiments, and can be implemented by various embodiments modified or improved based on the knowledge of those skilled in the art. Specifically, for example, in the above embodiments, the flux is used as viscous fluid; however, for example, any of various types of viscous fluid may be used, such as silver paste or liquid solder.

In the above embodiment, the flux supplied to storage tray 122 is flattened by squeegee 136 with the rotation operation of storage tray 122; however, storage tray 122 may be linearly moved so as to flatten the flux using squeegee 136. In this case, squeegee 136 is arranged to extend in a direction intersecting with the movement direction of storage tray 122. Alternatively, the flux may be flattened by squeegee 136 by moving squeegee 136 without rotating or moving storage tray 122. That is, the flux may be flattened by squeegee 136 by rotating or moving at least one of storage tray 122 and squeegee 136.

The shape of storage tray 122 is not limited to circular, and storage tray 122 with any of various shapes can be employed. For example, when at least one of storage tray 122 and squeegee 136 is linearly moved, a quadrangular storage tray 122 can be employed.

With flux unit 30 of the first embodiment, the flux is supplied to multiple portions of storage tray 122 by intermittently ejecting the flux from ejection port 156; however, the flux may be continuously ejected from ejection port 156. In this case, the flux is supplied in a rod-like shape to storage tray 122 such that the flux extends in the radial direction, but advantages similar to those of the first embodiment can be still obtained. When the flux is continuously ejected from ejection port 156, the supply amount of flux may be adjusted by adjusting the movement speed of slider 152. Specifically, for example, in a case where the flux is supplied to empty storage tray 122, when slider 152 is moved from the outer edge toward the center of storage tray 122 while the flux is continuously ejected from ejection port 156, the movement speed of slider 152 can be decreased at a portion nearer to the outer edge of storage tray 122, and can be increased at a portion nearer to the center of storage tray 122. Thus, the supply amount of flux can be increased at a portion nearer to the outer edge of storage tray 122, and the flux in storage tray 122 can be equalized in a shorter period of time. For example, in a case where the flux is resupplied to storage tray 122 storing the flux, when slider 152 is moved from the outer edge toward the center of storage tray 122 while the flux is continuously ejected from ejection port 156, the movement speed of slider 152 can be increased at a portion nearer to the outer edge of storage tray 122, and can be decreased at a portion nearer to the center of storage tray 122. Thus, the supply amount of flux can be increased at a portion nearer to the center of storage tray 122, and the flux can be appropriately resupplied.

In flux unit 30 of the first embodiment, the amount of flux to be used (hereinafter, described as "flux use amount") from storage tray 122 by the adhesion of the flux to an electronic component is calculated by controller 162 totaling the expected adhesion amount; however, the flux use amount may be written in a program in advance, and controller 162 may acquire the flux use amount from the program. In this case, controller 162 controls the operation of flux supply device 126 to resupply the flux to storage tray 122 by an amount corresponding to the acquired flux use amount.

In flux unit 200 of the second embodiment, flux supply body 216 is fixed to support table 218 at an end on the side with ejection port 232 with a small inner diameter; however, flux supply body 216 may be fixed to support table 218 at an end on the side opposite to the aforementioned end, that is, an end on the side with ejection port 232 with a large inner diameter. By fixing flux supply body 216 in this way, the flux can be supplied by a larger amount to a portion nearer to the outer edge of storage tray 122.

In the above embodiments, the flux stored in storage tray 122 directly adheres to an electronic component and the electronic component with the flux adhering thereto is mounted on a circuit board; however, the flux stored in storage tray 122 may be transferred to a circuit board, and an electronic component may be mounted on the transferred flux. Specifically, in this case, the distal end of a rod-shaped member is dipped in the flux stored in storage tray 122, so that the flux adheres to the distal end of the rod-shaped member. Then, the distal end of the rod-shaped member having the flux adhering thereto is brought into contact with a circuit board, so that the flux is transferred from the distal end of the rod-shaped member to the circuit board. Then, an electronic component is mounted on the circuit board with the flux transferred thereon, so that the electronic component is bonded to the circuit board.

REFERENCE SIGNS LIST

30: flux unit (viscous fluid supply device), 120: tray rotation device (first moving device), 122: storage tray, 126: flux supply device (ejection device), 136: squeegee, 148: ejection port moving device (second moving device), 156: ejection port, 160: control device, 170: calculating section (acquiring section), 172: operation control section, 200: flux unit (viscous fluid supply device), 202: flux supply device (ejection device), 227: storage section (accommodation section), 232: ejection port

The invention claimed is:

1. A viscous fluid supply device comprising:
a storage tray configured to store viscous fluid;
an ejection device configured to eject the viscous fluid to the storage tray;
a squeegee configured to adjust a film thickness of the viscous fluid by contacting the viscous fluid ejected to the storage tray by the ejection device; and
a first moving device configured to relatively move the storage tray and the squeegee,
wherein the ejection device includes an ejection port configured to eject the viscous fluid, and a second moving device configured to relatively move the ejection port and the storage tray,
the first moving device is a device configured to rotate the storage tray,
the viscous fluid supply device includes a control device configured to control operation of the ejection device, and
the control device controls the operation of the ejection device such that the viscous fluid is ejected by a larger amount to a portion nearer to an outer edge of the storage tray when the viscous fluid is ejected by the ejection device to the storage tray not storing the viscous fluid.

2. The viscous fluid supply device according to claim 1, wherein the second moving device relatively moves the ejection port and the storage tray in a direction different from a relative movement direction of the storage tray and the squeegee by the first moving device.

3. A viscous fluid supply device comprising:
a storage tray configured to store viscous fluid;
an ejection device configured to eject the viscous fluid to the storage tray;
a squeegee configured to adjust a film thickness of the viscous fluid by contacting the viscous fluid ejected to the storage tray by the ejection device; and
a first moving device configured to relatively move the storage tray and the squeegee,
wherein the ejection device includes an ejection port configured to eject the viscous fluid, and a second moving device configured to relatively move the ejection port and the storage tray,
the first moving device is a device configured to rotate the storage tray,
the viscous fluid supply device includes a control device configured to control operation of the ejection device, and
the control device controls the operation of the ejection device such that the viscous fluid is ejected by a smaller amount to a portion nearer to the outer edge of the storage tray after the viscous fluid stored in the storage tray has been used.

4. A viscous fluid supply device comprising:
a storage tray configured to store viscous fluid;
an ejection device configured to eject the viscous fluid to the storage tray;
a squeegee configured to adjust a film thickness of the viscous fluid by contacting the viscous fluid ejected to the storage tray by the ejection device; and
a first moving device configured to relatively move the storage tray and the squeegee,
wherein the ejection device has multiple ejection ports configured to eject the viscous fluid,
the first moving device is a device configured to rotate the storage tray, and
inner dimensions of the multiple ejection ports are smaller at portions nearer to an outer edge of the storage tray.

5. The viscous fluid supply device according to claim 4, wherein the multiple ejection ports are arranged in line in a direction different from a relative movement direction of the storage tray and the squeegee by the first moving device.

6. The viscous fluid supply device according to claim 4, wherein a distance between two adjacent ejection ports of the multiple ejection ports is larger at a portion nearer to the outer edge of the storage tray.

7. The viscous fluid supply device according to claim 4, wherein the ejection device has an accommodation section configured to accommodate the viscous fluid, the multiple ejection ports are connected to the accommodation section and configured to eject the viscous fluid accommodated in the accommodation section, and an accommodation amount of the fluid in the accommodation section is smaller at a portion nearer to the outer edge of the storage tray.

8. The viscous fluid supply device according to claim 1, wherein the viscous fluid supply device includes a control device configured to control operation of the ejection device, the control device is configured to
determine a use amount of the viscous fluid to be used in the storage tray in a mounting process, and
control the operation of the ejection device such that the viscous fluid is ejected to the storage tray by an amount corresponding to the use amount.

9. The viscous fluid supply device according to claim 3, wherein the second moving device relatively moves the ejection port and the storage tray in a direction different from a relative movement direction of the storage tray and the squeegee by the first moving device.

\* \* \* \* \*